(12) United States Patent
Brozek

(10) Patent No.: US 7,935,965 B1
(45) Date of Patent: May 3, 2011

(54) TEST STRUCTURES AND METHODS FOR ELECTRICAL CHARACTERIZATION OF ALIGNMENT OF LINE PATTERNS DEFINED WITH DOUBLE PATTERNING

(75) Inventor: Tomasz Brozek, Sunnyvale, CA (US)

(73) Assignee: PDF Solutions, Inc., San Jose, CA (US)

( * ) Notice: Subject to any disclaimer, the term of this patent is extended or adjusted under 35 U.S.C. 154(b) by 407 days.

(21) Appl. No.: 12/152,697

(22) Filed: May 16, 2008

(51) Int. Cl.
*H01L 23/58* (2006.01)
*H01L 21/66* (2006.01)
*G01R 31/00* (2006.01)

(52) U.S. Cl. .......... 257/48; 257/E21.524; 257/E23.179; 438/18; 324/750.16

(58) Field of Classification Search .............. 257/48, 257/E23.002, E21.521, E21.524, E23.179; 438/381, 424, 18, 14, 11; 324/765, 719, 324/513, 750.16, 750.3; 716/19, 21
See application file for complete search history.

(56) References Cited

U.S. PATENT DOCUMENTS

| | | | |
|---|---|---|---|
| 5,552,718 A * | 9/1996 | Bruce et al. ................ | 324/765 |
| 6,362,634 B1 * | 3/2002 | Jarvis et al. ................ | 324/719 |
| 2007/0148968 A1 | 6/2007 | Kwon et al. ................ | 438/671 |

OTHER PUBLICATIONS

Maaike Op de Beeck et al; Manufacturability Issues with Double Patterning for 50 nm Half Pitch Single Damascene Applications, Using RELACS Shrink and Corresponding OPC; Optical Microlithodgraphy XX, Proc SPIE vol. 6520, 2007.
Mircia Dusa et al; Pitch Coubling Through Dual Patterning Lithography Challenges in Integration and Litho Budgets; Optical Microlithodgraphy XX, Proc SPIE vol. 6520, 2007.
Byungjoon Hwang et al; Smallest Bit-Line Contact of 76 nm Pitch on NAND Flash Cell by Using Reversal PR (Photo Resist) and SADP (Self-Align Double Patterning) Process; Proc 2007 IEEE/SEMI Advanced Semiconductor Manufacturing Conf; pp. 356 ff.
Seo-Min Kim et al; Issues and Challenges of Double Patterning Lithography in DRAM; Optical Microlithodgraphy XX, Proc SPIE vol. 6520, 2007.

* cited by examiner

*Primary Examiner* — Thomas L Dickey
*Assistant Examiner* — Nikolay Yushin

(57) ABSTRACT

A test vehicle and method for electrical characterization of misalignment, for example resulting from double patterning processes, that enables characterization of patterns on wafers which have finished processing. It includes a structure and method for measurement of a space-sensitive electrical parameter to characterize gaps between features of different sub-patterns on a semiconductor wafer portion, and may further comprise a test structure for measuring feature dimensions.

13 Claims, 17 Drawing Sheets

TEST STRUCTURES AND METHODS FOR ELECTRICAL CHARACTERIZATION OF ALIGNMENT OF LINE PATTERNS DEFINED WITH DOUBLE PATTERNING

FIELD OF THE INVENTION

This invention relates to integrated circuit processing, and in particular to test structures and measurement/monitor method for characterizing very small pitch patterned features.

BACKGROUND OF THE INVENTION

As integrated circuit features and Critical Dimensions (CD's) get continually smaller, more and more stringent requirements are made on the lithographic processes for defining the patterns. Historically the resolution limits for, and therefore the limits for the utility of, optical lithography, have been pushed smaller and smaller with time, as is illustrated in FIG. 1. This has necessitated the use of smaller optical exposure wavelengths. Currently available manufacturing lithography solutions are based on 193 nm dry or immersion/wet lithography (using ArF lasers for exposure), with the resolution limit being at about a 65-70 nm pitch. As CD's and pitches become even smaller other methods are proposed to overcome the printability issues.

Double patterning has been proposed to overcome these issues, using several solutions and integration schemes. US Patent Publication 20070148968 describes some of these schemes, as do the following publications:
1. Maaike Op de Beeck et al; Manufacturability Issues with Double Patterning for 50 nm Half Pitch Single Damascene 'Applications, Using RELACS Shrink and Corresponding OPC; Optical Microlithodgraphy XX, Proc SPIE Vol 6520, 2007;
2. Mircia Dusa et al; Pitch Doubling Through Dual Patterning Lithography Challenges in Integration and Litho Budgets; Optical Microlithography XX, Proc SPIE Vol 6520, 2007;
3. Byungjoon Hwang et al; Smallest Bit-Line Contact of 76 nm Pitch on NAND Flash Cell by Using Reversal PR (Photo Resist) and SADP Double Patterning) Process; Proc 2007 IEEE/SEMI Advanced Semiconductor Manufacturing Conf; pp 356 ff;
4. Seo-Min Kim et al; Issues and Challenges of Double Patterning Lithography in DRAM; Optical Microlithodgraphy XX, Proc SPIE Vol 6520, 2007.

As seen in the above references, there are two main approaches in the art to double patterning. The first approach involves dual exposure, with a double or a single etch. In this case, the CD's and spaces depend on the precision of both exposures and their mutual alignment. The second approach, Self-Aligned Double Patterning (SADP), requires only one exposure under critical conditions, with a complementary pattern being created in a non-lithographical way. The Self-Aligned Double Patterning can be accomplished by a Positive Tone method or a Negative Tone method A first solution, illustrated in FIG. 2, is double exposure—it can be executed with a single or double etch. In an exemplary implementation, in order to transfer a pattern to a substrate 205, a hard mask 210 and a resist 215 are used for patterning. A first patterning step and etch step yield a set of patterns 220 in the resist and hardmask. The second patterning step is used to generate patterns 225 in a resist in addition to the patterns already transferred to hardmask. The second pattern features, together with the first patterning features create the pattern with dimensions not achievable with single exposure. The final pattern 230 on the substrate is achieved by etching the target material using a mask, which combines the first pattern pre-etched in hardmask layer and the second pattern of resist.

A second solution is known as self-aligned double patterning with spacers. This solution utilizes spacers and sacrificial layers to create a complementary line pattern aligned to the original line pattern. Two different methods of self-aligned double patterning are known as positive tone and negative tone patterning. Positive tone patterning is illustrated in FIG. 3a. Target layer 300 is covered by a sacrificial template layer 305. resist layer 310 exposure and development is used to yield features 315 with a pitch twice the target pitch, and required linewidth. The pattern is etched off in the sacrificial template layer, and the resist is removed. Sidewall spacers 325 of width equal to the desired width of the target lines are then formed, adjacent to the pattern lines, using a standard methods of conformal deposition of a film followed by an isotropic dry etch. The spacer processing exposes the tops of the sacrificial template layer which then is selectively removed, leaving behind the sidewall spacers. The spacers, which have a desired pitch of the target pattern, are used as masks during the etching of final pattern in target layer, and then stripped.

Negative tone patterning is illustrated in FIG. 3b. The flow is similar to positive tone patterning up through the formation of the sidewall spacers 325, which for this particular flow are sacrificial spacers. At this point, another sacrificial layer 330 is deposited as a gap fill, and then planarized down to the top of the spacers, to create a pattern which is complementary to the spacer pattern. At this point the sacrificial spacers are removed, leaving remaining pattern features 335, with a pitch equal to the target pitch. Those features are used as a mask during etching of the final pattern into the target layer. FIGS. 3a and 3b are from *Bencher, C., SADP: The Best Option; Nanochip Tech. Journal, issue* 2007, pg. 8.

Patterns generated by double patterning may have more variability issues than those from single patterning. Each sub-pattern, i.e., the portion of the pattern produced by a different portion of the double patterning process, (e.g., the gap fill features vs. the line features in the negative tone patterning) has its own CD control issues, and additionally problems can result arising from the mutual alignment of the sub-patterns. In general, for the purposes of this disclosure, a sub-pattern will refer to a portion of the pattern which is produced by the same process steps and which is affected in the same way, e.g. in terms of feature dimensions and alignment, by process or other variations. These CD and alignment issues are manifested differently for the three types of double patterning outlined above and can affect the individual linewidths, the line-to-line spacing, and alignment error. FIG. 4 illustrates a pattern generated by a double patterning process. Features A and B shown in cross section represent features resulting from differing steps in the double patterning processes, and the spaces may also be non-symmetric, depending on how the spaces are oriented to features A and B. Table 1 below summarizes the sources of variability, and their impact on line CD's, line spacing, and line-to-line alignment for the three types of double patterning.

TABLE 1

Potential Line Width and Space Variation in Double Patterning

| Double Patterning scheme | Double Exposure (two litho steps with pattern alignment) | | | Self-Aligned Double Pattern with Spacer (Positive Tone: Lines) | | Self-Aligned Double Pattern with Spacer (Negative Tone: Spaces) | |
|---|---|---|---|---|---|---|---|
| Sources of variability | Line1 CD | Line2 CD | Line1-Line2 Alignment | Line1 CD | Spacer thickness | Line 1 CD | Spacer thickness |
| Impact on Line CD | Direct on Line1 | Direct on Line2 | None | None | Direct - same impact on both lines | Direct - wider Line1 will also cause smaller Line2 CD | No impact on Line1 CD, change in Line2 CD |
| Impact on Line Spacing | Both spaces change similar | Both spaces change similar | Spaces change, but sum of neighbor spaces remains same | Direct, but sum of neighbor spaces remains same | Only one space width is modulated by spacer thickness | None | Direct - both spaces with change the same way as spacer width |
| Impact on Line-Line Alignment | None | None | Direct | Direct, error in defining the first space will cause a mismatch between spaces and will be seen as alignment error | Spacer thickness (sets Line CD) will impact only one space, and mismatch between spaces will be seen as alignment error | None | None |

Note that in Table 1, CD and alignment errors are treated separately, but they may occur simultaneously, further complicating the resulting Line/Space variation.

To monitor and control the double patterning processes, measurements need to be made of lines, spaces, CD's, and line-to-line alignment. The standard method for doing this involves SEM-based CD measurements for lines and spaces. This method is time consuming, and it can be done only with an exposed pattern. CD-SEM's are well suited to doing in-line, real-time process characterization so as to make mid-course corrections, but the amount of data collected is limited not only due to the actual time and costs of doing the CD-SEM's, but also due to the associated costs of delaying processing. As a result, detailed in-line characterization of many points usually does not happen using CD-SEM analysis. And CD-SEM measurement after completing the processing necessitates destructive and costly failure analysis An electrical test vehicle and method which could provide CD, linewidth, space width, and alignment data to characterize the double patterning processes would be preferable for its capability to obtain large amounts of data collection after processing. Furthermore, electrical tests would also provide information about process variability and/or possible mis-processing. Such electrical tests would be very well suited for building the database and providing a feedback loop process for performance and yield of manufactured products.

SUMMARY OF THE INVENTION

It is therefore an object of this invention to provide a test vehicle and method for electrical characterization of double patterning processes.

It is a further object of this invention to provide a test vehicle and method for electrical characterization of double patterning processes that enables characterization of patterns on wafers which have finished processing.

These objects are met by the inventive test vehicle and method described hereinafter.

DETAILED DESCRIPTION OF THE INVENTION

The present invention provides a vehicle and method that allow electrical, non-optical, characterization of misalignment of two sub-patterns of dense lines such as those created with double patterning. By using electrical rather than optical methods, characterization of patterns can be accomplished on wafers which provide in-process electrical access to the encapsulated patterns or on wafers which have finished processing. Furthermore, the electrical test methods enable fast measurements to collect multiple test results across the wafer and across the die, using the existing parametric test infrastructure.

Figure 1:
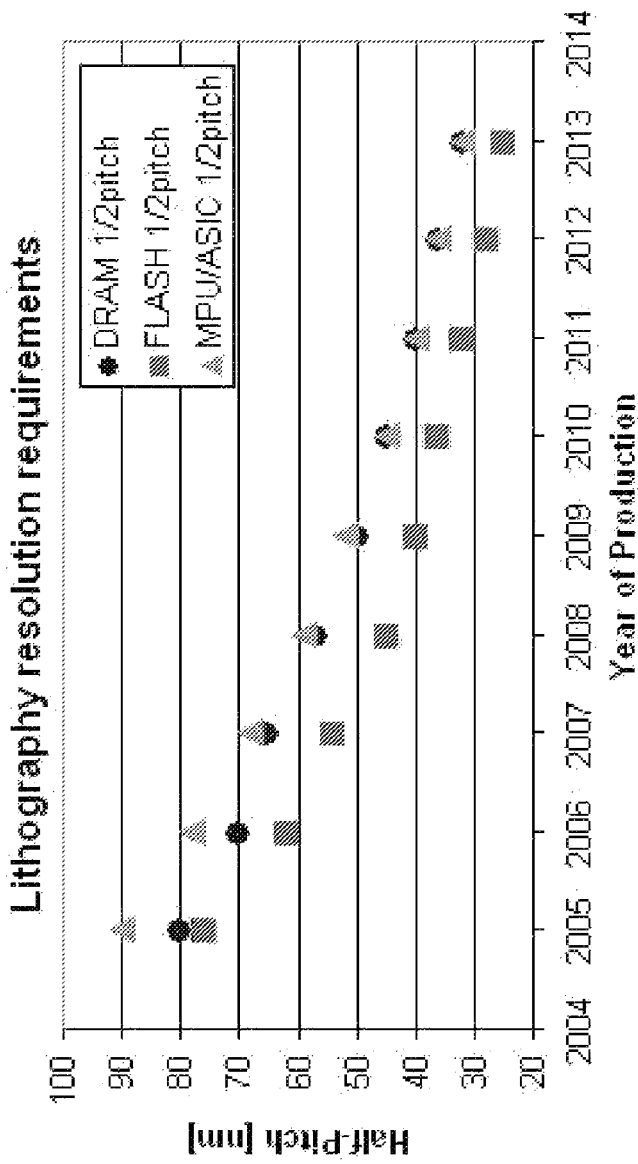
FIG. 1 illustrates the evolution of optical lithographic rules with time.
Figure 2:
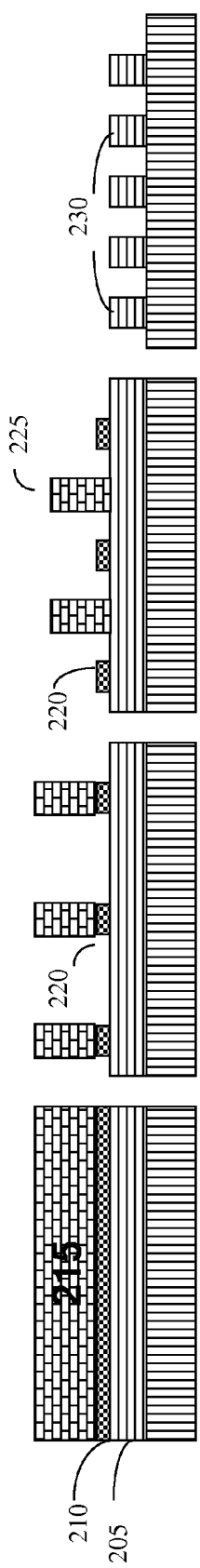
FIG. 2 illustrates double patterning with double exposure and a single etch.
Figure 3A:
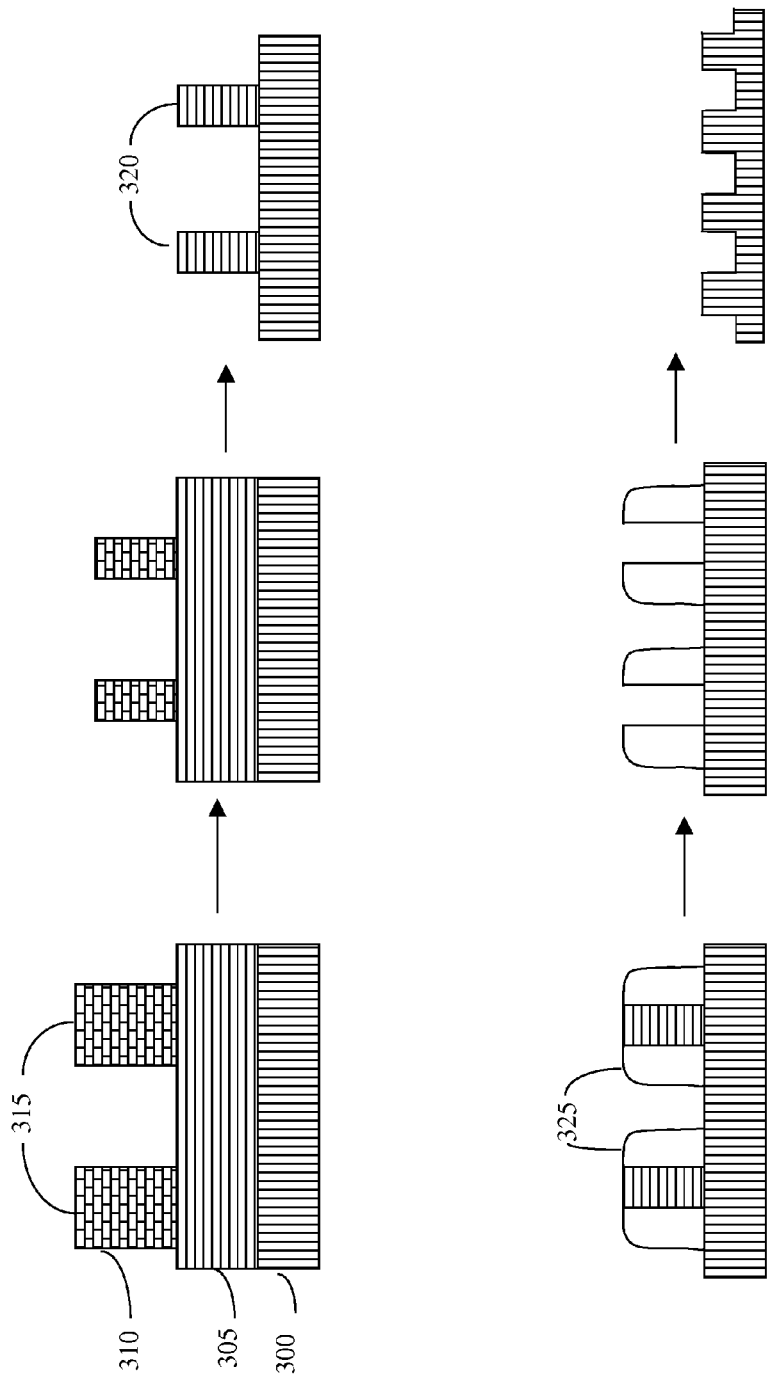
FIG. 3a illustrates SADP with positive tone patterning.
Figure 3B:
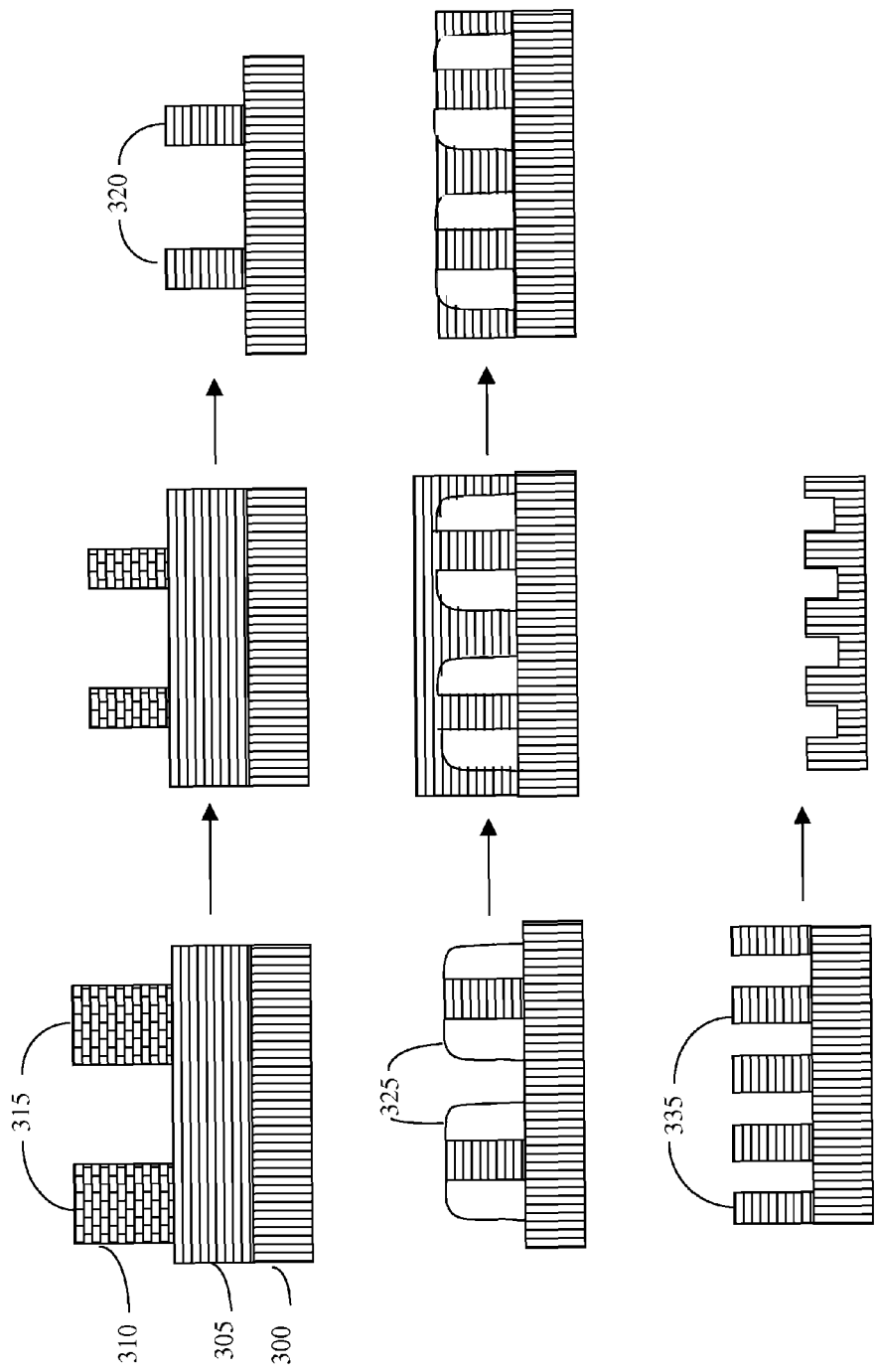
FIG. 3b illustrates SADP with negative tone patterning.
Figure 4:
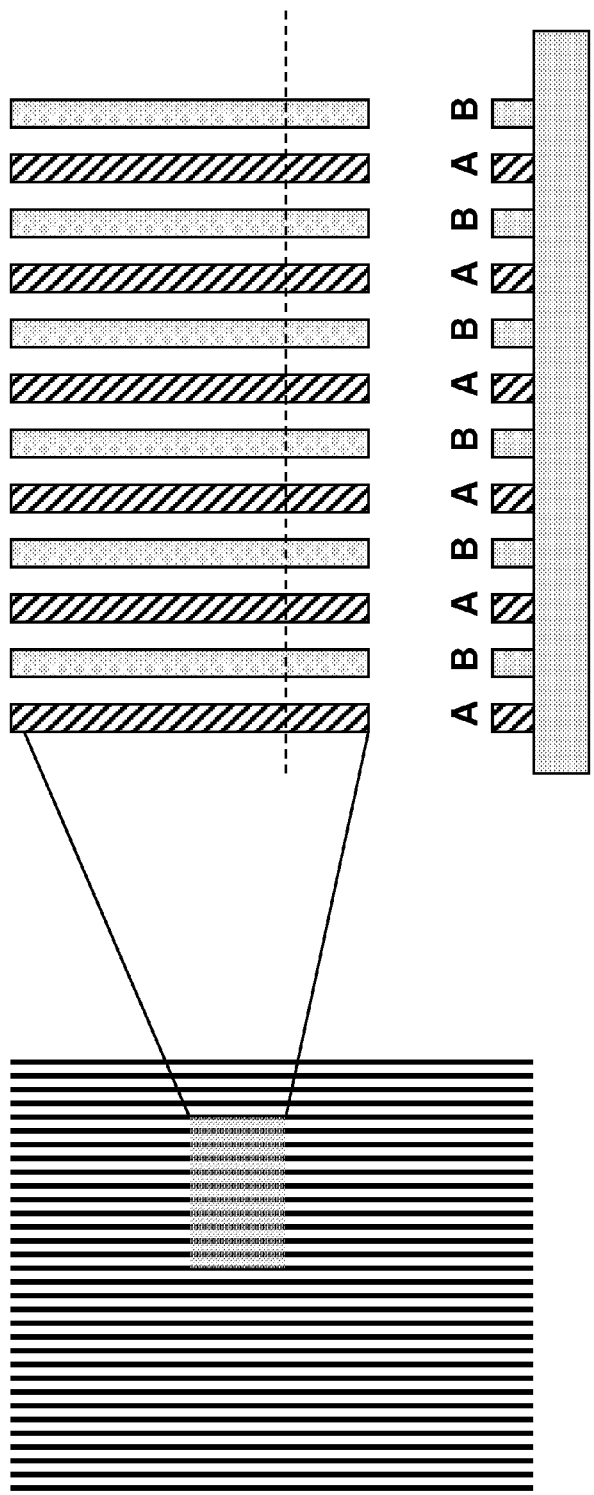
FIG. 4 illustrates a pattern generated by a double patterning process.
Figure 5A:
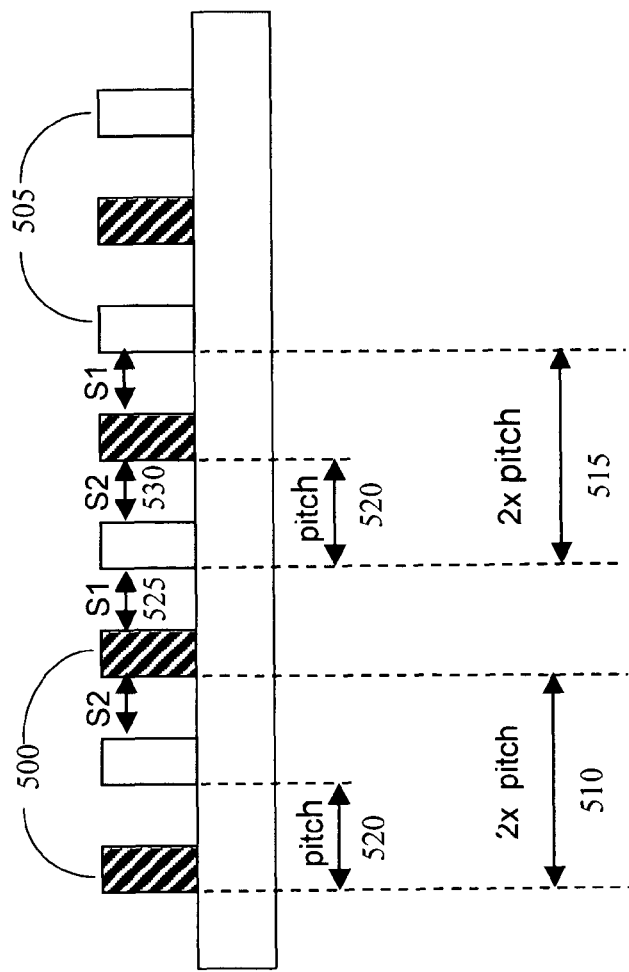
FIG. 5a illustrates good alignment which may occur between features of pattern A and pattern B of double patterning.
Figure 5:
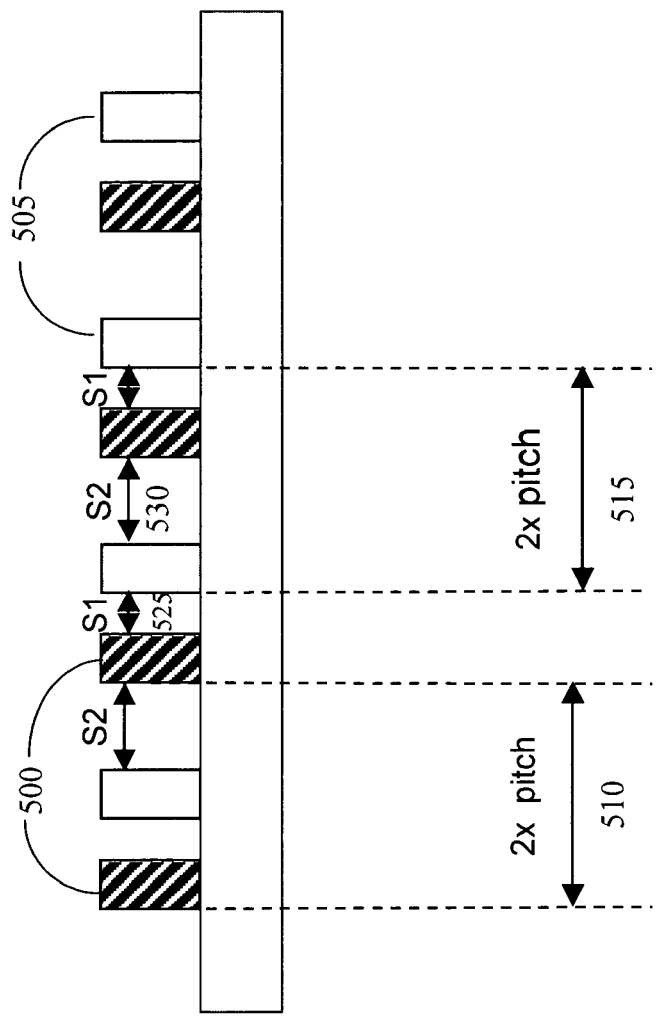
FIG. 5b illustrates misalignment which may occur between features of pattern A and pattern B of double patterning.

FIG. 5 illustrates misalignment which may occur between features of sub-pattern A and sub-pattern B, which may have been produced using methods including but not limited to any of the double patterning methods described above, and summarized in Table 1. FIG. 5a shows a case of good alignment. Lines 500 are from sub-pattern A, and lines 505 are from sub-pattern B. Lines 500 have pitch 510, and lines 505 have pitch 515. Both pitches 510 and 515 are intended to be equal, and are twice the final interleaved pitch 520. Two types of spaces exist: spaces S1 (525) have features 500 on the left from the perspective of this drawing, and spaces S2 (530) have features 500 on the right from the perspective of this drawing. If the alignment is good as is illustrated here, spaces S1 525 and S2 530 are substantially equal. FIG. 5b shows misalignment, which results in spaces S2 530 being considerably larger than spaces S1 525.

The present invention introduces a method and a corresponding test structure (or vehicle) to electrically characterize misalignment as illustrated in FIG. 5. The principal of the test method and vehicle is as follows: The proposed measurements of alignment are based on the electrical characterization of the gaps between one line belonging to a first sub-pattern set, and its neighboring lines on both sides, both belonging to the second sub-pattern set. While the gap width can be calculated based on electrical measurements, its absolute value may include significant error due to the unknown absolute value of the dielectric constant of the material filling the gap, the exact line height, and other factors. However, by performing electrical measurements characterizing both gaps and comparing them, their differential values can quantify the alignment of the line to its neighbors. The features from the different sub-patterns can be combined in different configurations to obtain differential signal changes. It can also be possible to combine multiple instances of the same pattern to increase the electrical signal and increase sensitivity.

Figure 7:
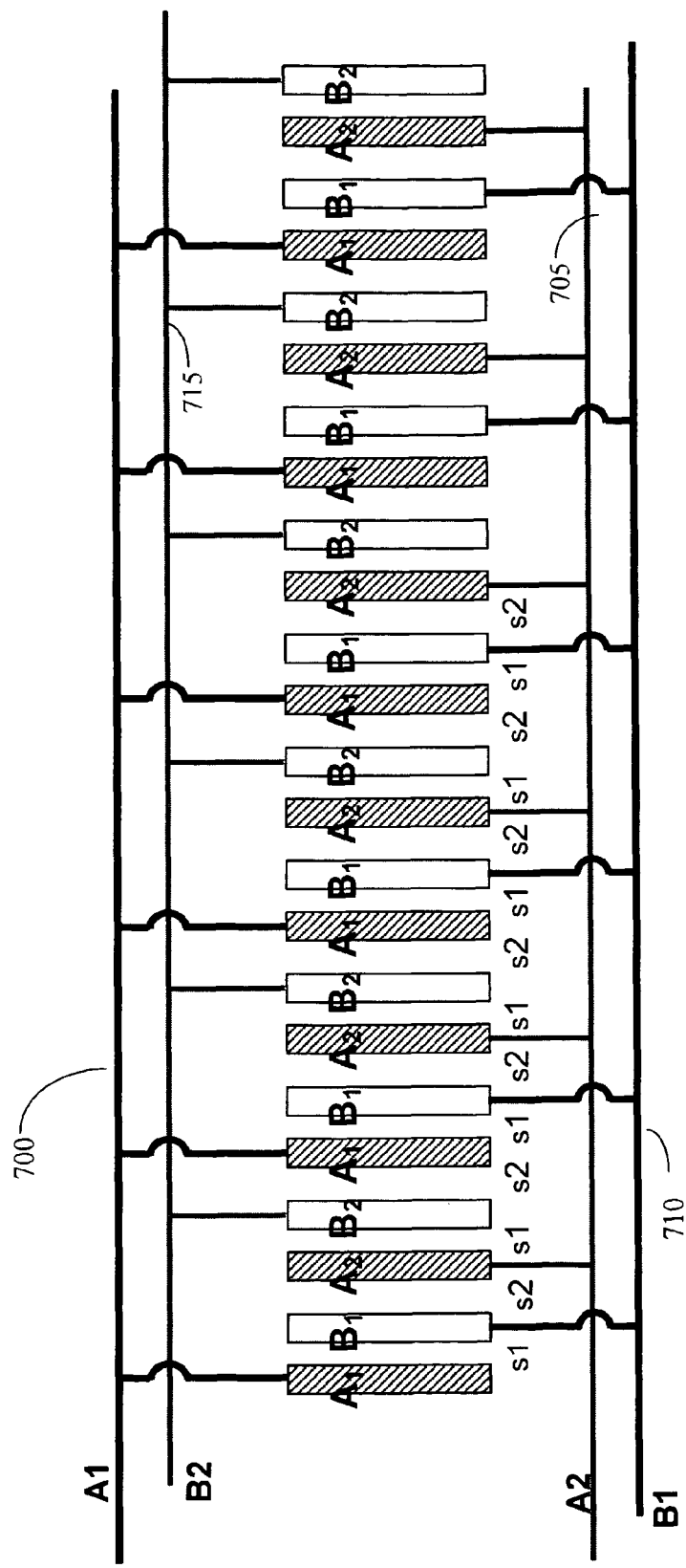
FIG. 7 illustrates an exemplary layout and connection of sub-grouped lines.

An exemplary embodiment is illustrated in FIGS. 7 and 8, wherein the electrical signal measured is capacitance, and the combining of different configurations and multiple instances is accomplished using a sub-grouping scheme as described below. As will be described hereinafter, other types of spacing-dependent electrical signals can be used in place of capacitances, for example leakage currents.

Figure 6:
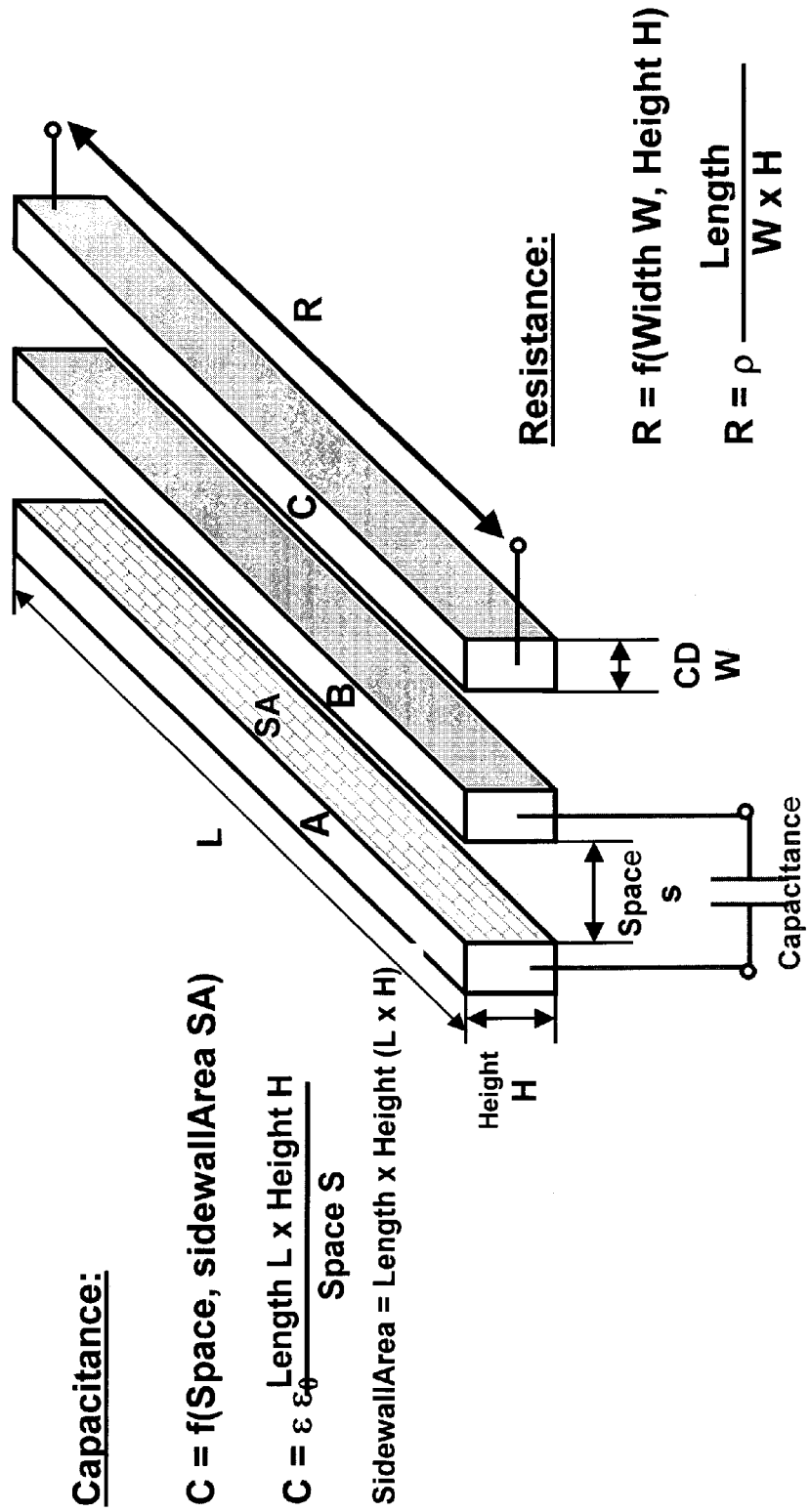
FIG. 6 shows the capacitance and resistance equations as a function of length and height of feature lines, as well as spacing between the lines.

The exemplary embodiment involves measuring the capacitances between lines 500 and lines 505, as in FIG. 5. The capacitance between the lines depends on the spacing between them, properties of the material filling a gap between them, as well as the height and length of the lines and their slopes. FIG. 6 shows the capacitance equations as a function of length and height of feature lines (i.e., sidewall area), as well as spacing between the lines. The equations for resistance of lines are also shown on the figure. These equations are well-known, and are applied here to conducting lines used in integrated circuits, .e.g. for interconnects. In order to decouple the above parameters from the misalignment, our inventive structure and method measures the capacitances related to spaces 525 and 530 separately. The differential of the two capacitances is used to quantify the misalignment as follows, utilizing the equations of FIG. 6:

$C = \epsilon \epsilon_0 LH/S$, where S=the space between adjacent lines, and L and H are the length and height of the lines. Referring back to FIG. 5, S1 and S2 are the two types of spaces between the two patterns. If two capacitances $C1 = \epsilon \epsilon_0 LH/S1$ and $C2 = \epsilon \epsilon_0 LH/S2$ (where $\epsilon$ is the permittivity of the material between the two lines, and $\epsilon_0$ is the permittivity of free space), are measured, the misalignment $M = \frac{1}{2}|S1-S2|$ can be determined to be $$M = \frac{1}{2}|S1-S2| = \frac{1}{2}\epsilon\epsilon_0 LH |1/C1 - 1/C2|$$

The exemplary test structure for independent characterization of spaces 525 and 530 can be built by sub-grouping lines in pattern A, i.e. lines 500, and lines in pattern B, i.e. lines 505. Lines A (500) are sub-grouped into A1 and A2, and lines B (505) are sub-grouped into B1 and B2. It should be noted that the described test structures and test method can be used to characterize all sources of variability—line CD and spaces of the features belonging to the two sub-sets of the pattern. As can be seen from Table 2, the impact of variations from various elements, not only alignment, on measured parameters may be different depending on double patterning scheme used to create a pattern.

FIG. 7 illustrates the layout and connection of sub-grouped lines. All A1 lines are electrically connected to one another by A1 interconnects 700; correspondingly A2, B1, and B2 lines are electrically connected to one another by A2 interconnects 705, B1 interconnects 710, and B2 interconnects 715. Given this layout, spaces S1 are spaces between lines A1 and adjacent B1 lines or A2 and adjacent B2 lines, whereas spaces S2 are spaces between lines B1 and adjacent A2 lines or B2 and adjacent A1 lines.

Figure 8A:
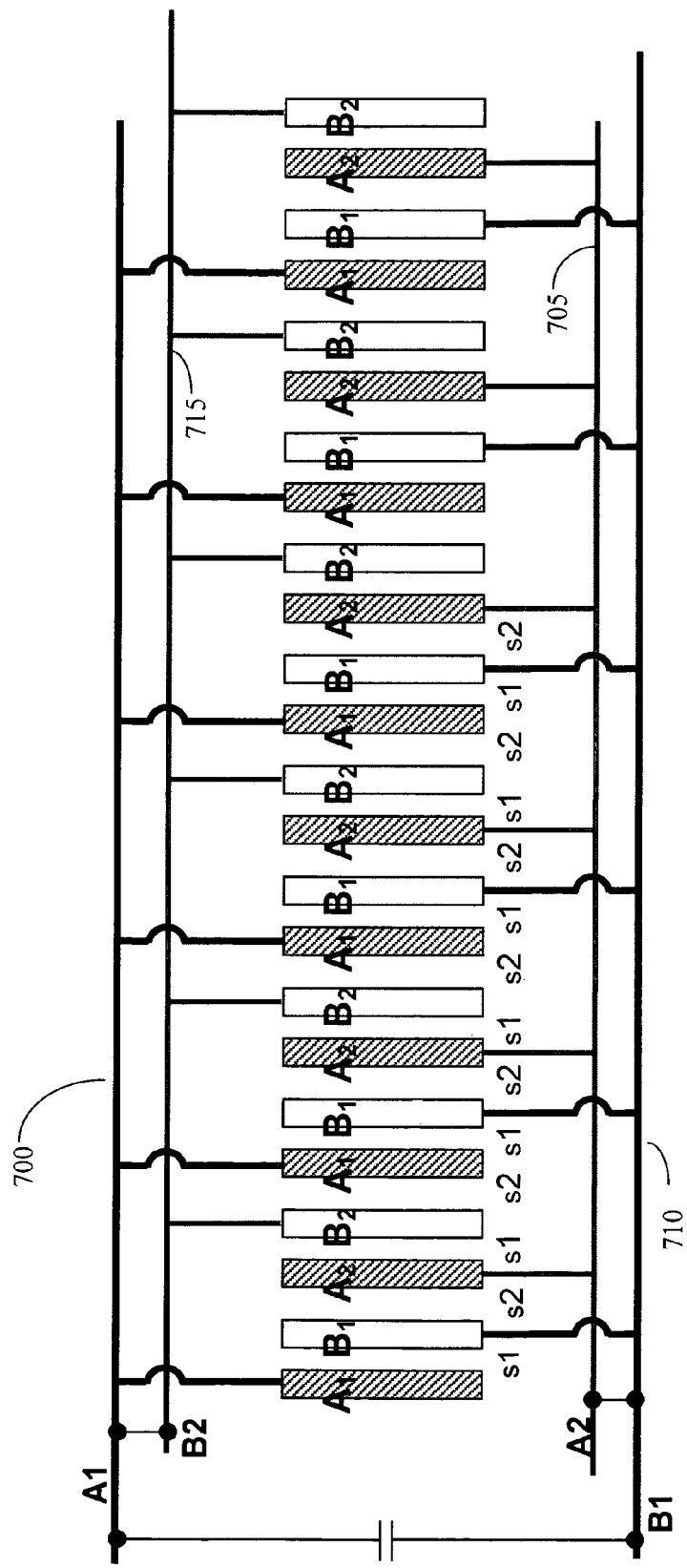
FIG. 8a illustrates a capacitance measurement configuration between a first set of features in the exemplary layout of FIG. 7., to characterize space S1

In order to measure capacitance C1 corresponding to spaces S1, capacitance measurements are made between lines A1 and B1. This configuration is shown in FIG. 8a. Since the capacitance may be very small, multiple A1-B1 line pairs can be measured simultaneously to create a multiplicity of the capacitive pairs, which provide additive capacitance. It is desired to eliminate or minimize any contribution to the measured capacitances from nearby non-equivalent pairs such as B1-A2 or A1-B2. This is accomplished by appropriate connection of those lines not being tested during the test; i.e., B1 and A2 lines are shorted together, as well as A1 and B2 lines.

Figure 8B:
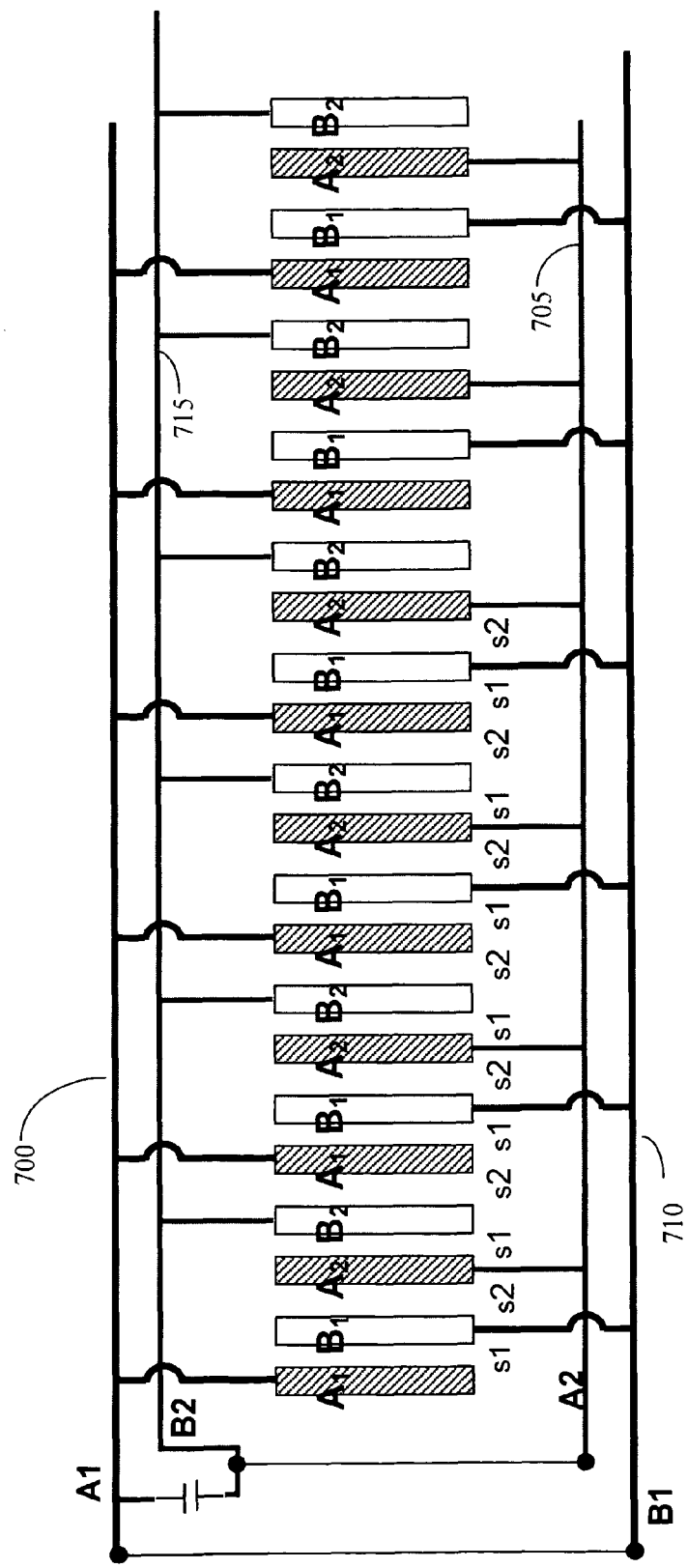
FIG. 8b illustrates a capacitance measurement configuration between a second set of features in the exemplary layout of FIG. 7., to characterize space S2.

Similarly, in order to measure capacitance C2 corresponding to spaces S2, capacitance measurements are made between lines A1 and B2. This configuration is shown in FIG. 8b. Once again, multiple lines can be connected together into comb structures to create multiplicity of the capacitive pairs.

Therefore, as shown in FIG. 7, the whole pattern is divided into 4 sub-groups of interlaced lines enabling capacitive measurements between each pair of closest neighbors, and therefore electrical testing to determine misalignment or changes in spaces, instead of the typical visual measurements by SEM. It should be clear, however, that the described solution is not the only one which can be used to measure electrical characteristics of spaces S1 and S2 and determine their values and mutual relations. The example given proposes a structure which maximizes the sensitivity while using minimum area taken by the test structure.

Figure 8C:
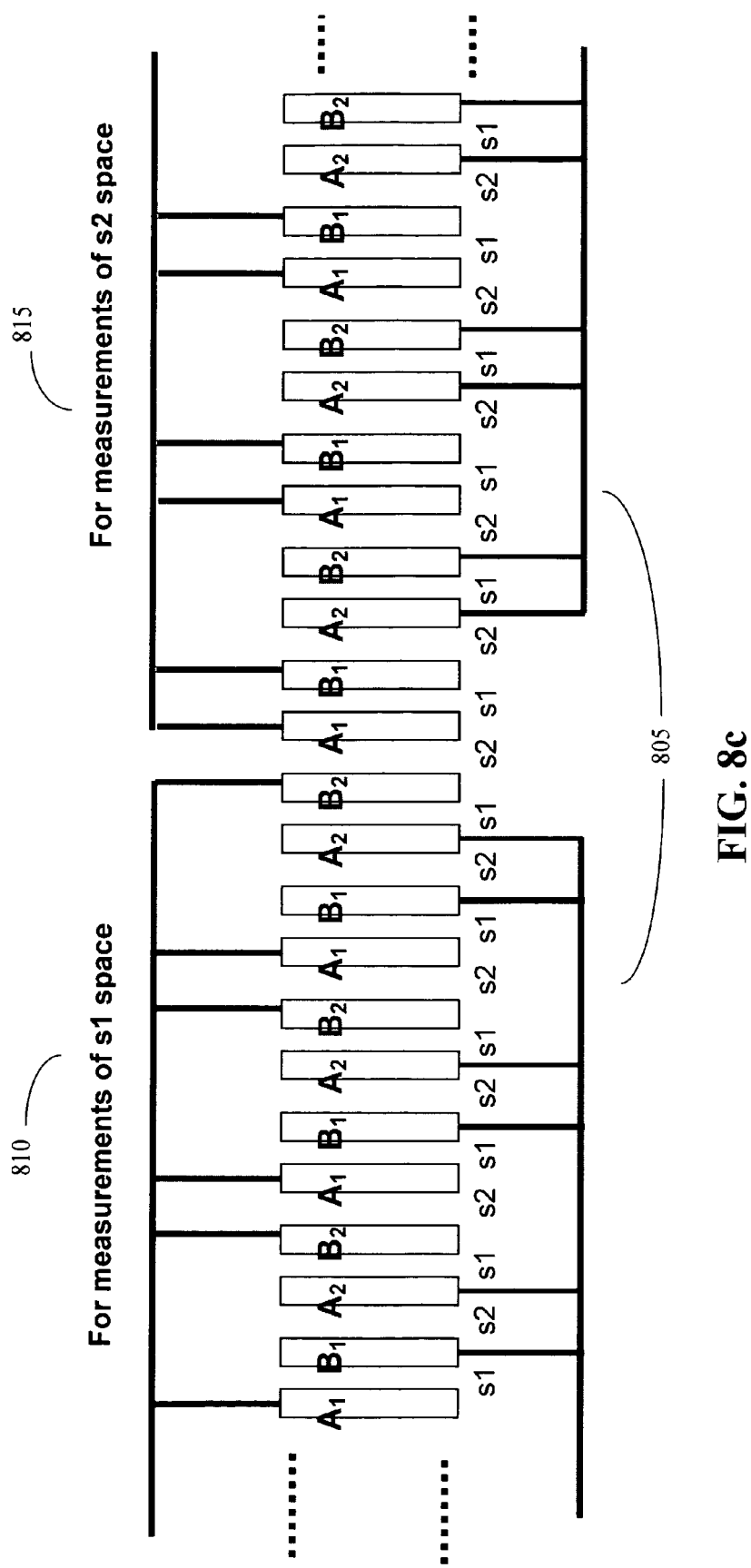
FIG. 8c illustrates a capacitance measurement configuration using two separate test structures in close vicinity, each used to separately characterize said spaces S1 and S2.

It is also possible to build two or more test structures, which reside close to each other, which will be dedicated to separate measurements of spaces S1 and S2. A sub-embodiment measuring capacitances for different combinations of features and multiple instances is illustrated in FIG. 8c., wherein two separate test structures 805 are built in close proximity, so that they represent the same local properties of the process. The sizes of each structure 805 and the features therein should be exactly the same, i.e., the same number/dimensions of lines and spaces, to provide a direct comparison between electrical measurements used to characterize corresponding spaces. Although the configuration shown in FIG. 8c requires twice the area of the "switching" configuration of FIGS. 8a and 8b, it provides an advantage in that measurements can be performed using only a single conducting layer, without involving multilayer interconnects for line crossing, overpass and/or underpass connections. In FIG. 8c, structure 810 is configured to measure s1 spaces, whereas structure 815 is configured to measure s2 spaces.

Figure 9A:
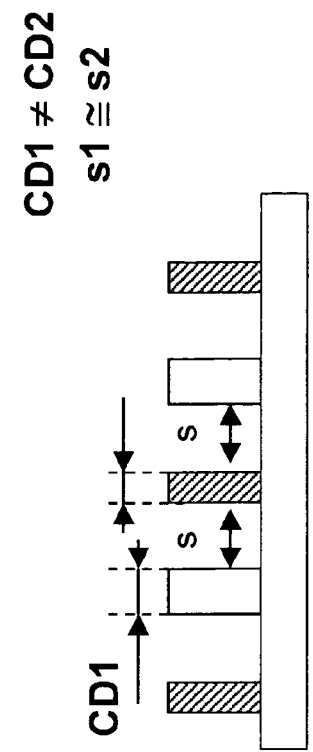
FIG. 9a illustrates line space variation due to line width (CD) variation of the lines in the two sub-patterns
Figure 9A:
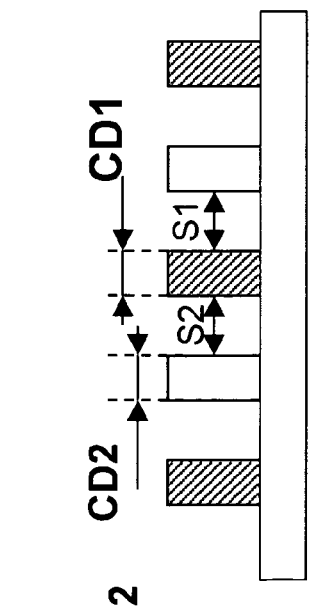
Figure 9B:
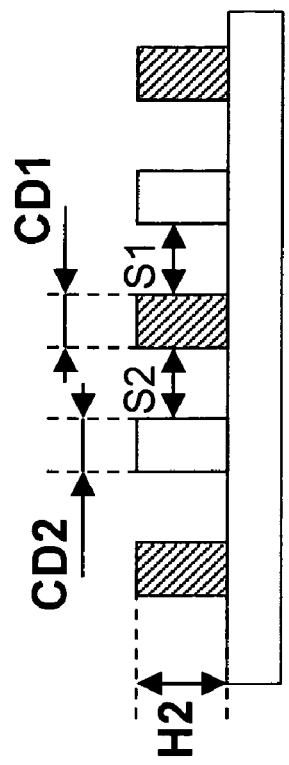
FIG. 9b illustrates line height variation which can impact measured capacitance; the height variation can occur between various areas on a wafer or between wafers.
Figure 9B:
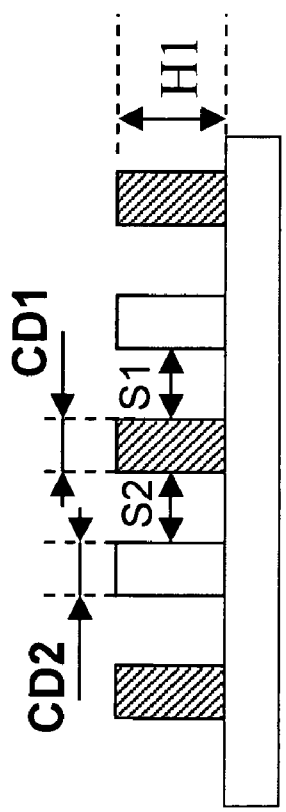

The method as described above is accurate if the feature lines are straight and of uniform width and height. However, in addition to misalignment, other factors can have an impact on measured interline capacitance. First of all, there can be line space variation due to line width (CD) variation of the lines patterned in the different sub-patterns. This situation is illustrated in FIG. 9a. This type of variation will impact both types of spaces equally but will affect the measured capacitances. Secondly, as illustrated in FIG. 9b, there can be line height variation, either between the lines patterned in the different exposures, or across a wafer, or wafer-to-wafer. Although this will not affect CD's or spaces, and the ratio of corresponding capacitances for the two types of spaces will not change, their absolute values and differential will be impacted. A third potential factor that would affect measured capacitances is variation of the dielectric constant of the material filling the spaces between the lines. Each of the above factors will cause capacitance change, and may impact the differential between the two capacitances.

An embodiment of the present invention provides for additional test structures and a method of characterization which would enable measurement of feature dimensions such as line widths and heights, thereby improving the accuracy of the electrical spacing-dependent, e.g., capacitance measurement-based diagnostics.

Figure 10:
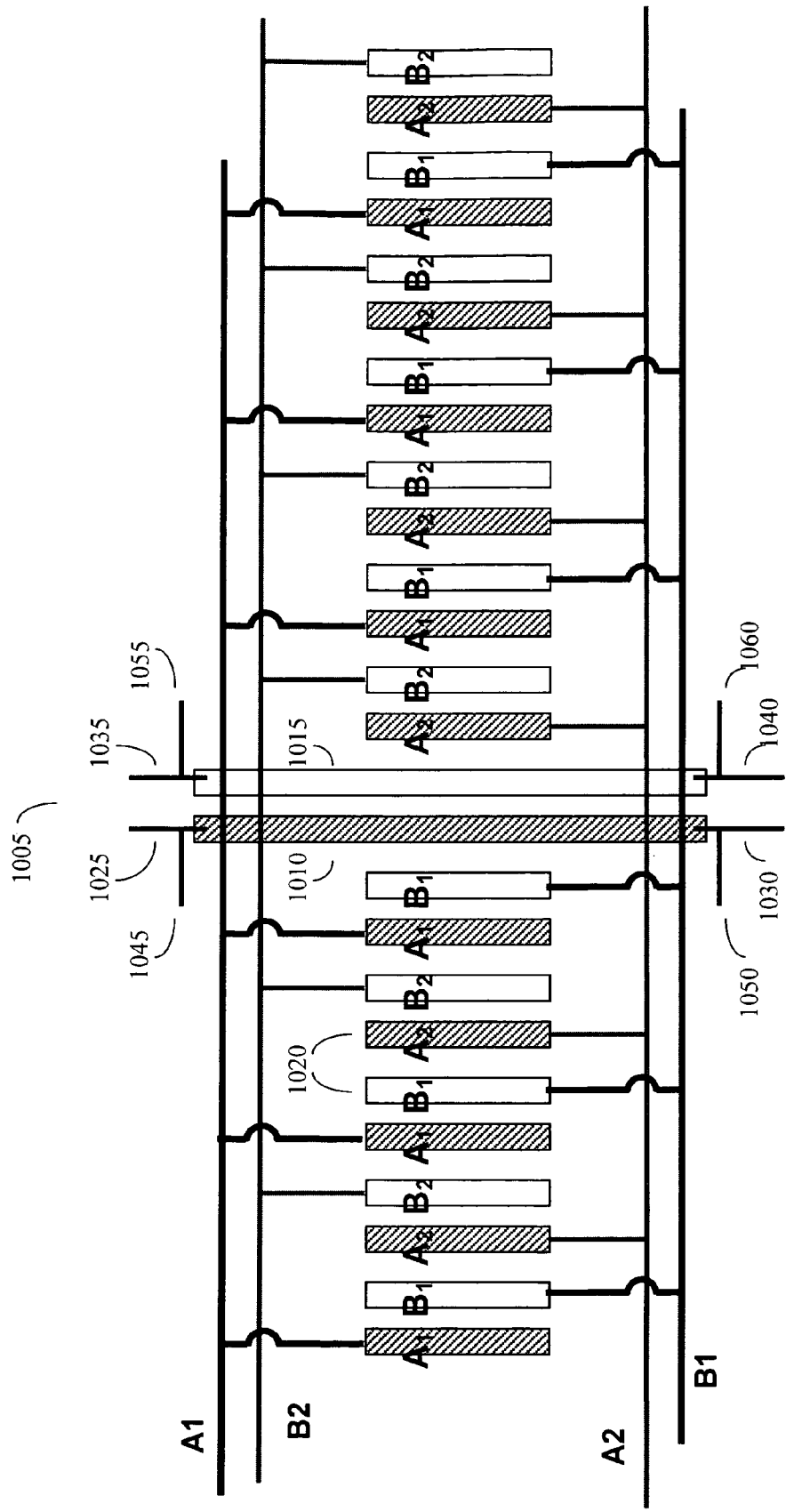
FIG. 10 shows the capacitance measurement structures of the present invention, along with Kelvin resistance measurement structures.

According to an embodiment of the present invention, the test structures for capacitance measurements include lines connected in such a way as to enable precise resistance measurements, e.g., standard Kelvin structures. Briefly, a four-terminal Kelvin structure measures the resistance across a conducting line between two contacts by flowing a current through the two contacts, but measuring the voltage drop via a third and fourth contact that have no current flowing through them. FIG. 10 shows the capacitance measurement structures 1020 of an embodiment of the present invention, along with Kelvin resistance measurement structures 1005. These include lines 1010 patterned along with lines A and line 1015 patterned along with lines B, both of which are designed with the same height and width as the capacitance measurement lines 1020. Current is passed between terminals 1025 and 1030, and between terminals 1035 and 1040, and resistances are measured between terminals 1045 and 1050, and between terminals 1055 and 1060. It should be noted that the lines dedicated to resistance measurements do not have to reside within the alignment test structure for measuring the spaces between the lines—they can be located in close proximity, to represent the same local process characteristics as seen by the alignment structures.

The combination of the capacitance measurements (or other electrical measurements) for space characterization, and well as the resistance measurements for line width and height characterization provides an example of a complete solution to electrically characterize CD and alignment in the double patterning scheme.

The proposed structures of this embodiment, including capacitance measurement lines or combs, and resistance measuring Kelvin structures, would be used to characterize CD and alignment variability in the manufacturing process. This would be of particular use for layouts having regular patterns, including, but not limited to SRAM, non-volatile memory such as NAND, or DRAM designs. The principles used for test structures built from regular patterns can also be applied to characterize misalignment of non-regular features generated with double patterning. The test structures can be used on many conducting layers, for example active, poly, local interconnect, contact, metal. In order to characterize the spatial effects, the structures could be multiplicated across the reticle field, and/or across the wafer. For the embodiment described which measures capacitances and resistances, a set of four parameters would be measured on each set of structures; 1) C1, representing inter-line spacing S1; 2) C2 representing inter-line spacing S2; 3) R1, representing the resistance of a line from sub-pattern A; and 4) R2, representing the resistance of a line from sub-pattern B. From these four parameters, calculations can be performed to obtain and characterize the critical quantities: CD1, CD2, S1, S2, and H(height). Five equations are used to extract these quantities:

1) $C1 = \epsilon\epsilon_0 LH/S1$

2) $C2 = \epsilon\epsilon_0 LH/S2$

3) $R1 = \rho L/HCD1$, where $\rho$ is the resistivity of the material;

4) $R2 = \rho L/HCD2$

5) $S1 + S2 + CD1 + CD2 = 2 \times \text{pitch}$

In some cases, additional measurements may be required to identify material properties changes, e.g., material resistivity or dielectric permittivity.

Another embodiment of the present invention uses measurement of conduction current (in dielectrics sometimes called leakage current: for the purposes of this discussion, the terms will be used interchangeably) in place of capacitance measurements as a space-sensitive electrical parameter to characterize dielectric-filled gaps between features of different sub-patterns. Whereas capacitance value has a hyperbolic dependence on the space between two conductors (i.e., C is proportional to 1/S), the leakage current $I_L$ has an exponential dependence on the electric field, i.e., $I_L$ is proportional to $\exp(1/S)$. Thus it may have a stronger dependence on space variation than does capacitance, and higher sensitivity to misalignment. Sensitivity is defined here as a change in the measured parameter due to a change of the space gap value.

The measurement of $I_L$ can be performed under various electrical conditions by applying a voltage or forcing a current between two lines or sets of lines, in a configuration similar to that described earlier for capacitance measurements. Leakage measurements may be more sensitive to local variation, while the capacitance measurement is more "global" by averaging the space across the whole structure.

Measurements of conduction current through the dielectric layer between metal plates is a well-known technique used in MOS or MIM capacitors, and can easily be applied to the case of conducting lines. The mechanism of conduction depends on the dielectric material and can include tunneling (Fowler-Nordheim mechanism), hopping (Pool-Frenkel mechanism), ionic transport, or other mechanisms, which are well known and well characterized. Conduction in dielectrics is described, e.g., in *Interlayer Dielectrics for Semiconductor Technologies* by S. P. Murarka, M Eizenberg, A. K Sinha, 2003; Academic Press pp. 11-13

Figure 11A:
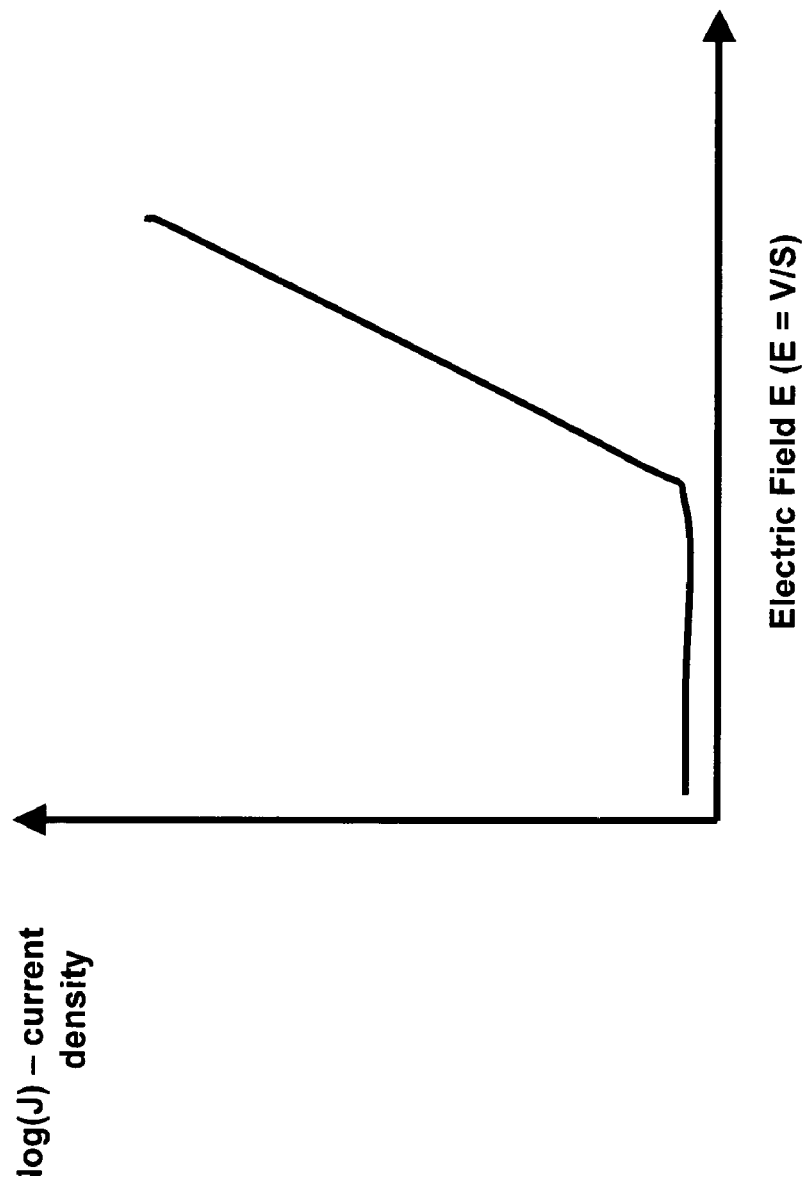
FIG. 11a shows an example of a typical I-V (Current-Voltage) characteristics curve for leakage current.
Figure 11B:
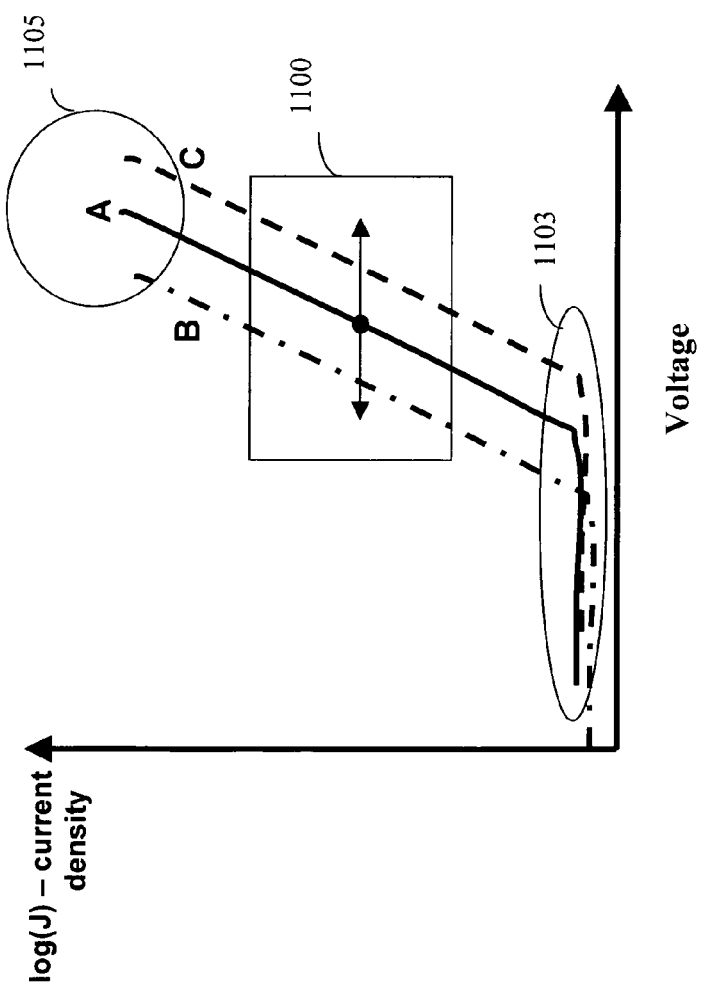
FIG. 11b shows how the I-V characteristics change according to alignment cases.

In most cases, the leakage current exhibits exponential behavior with respect to the electric field, and is proportional to the sidewall area, as seen from the equations $$J \sim \exp(E); J \sim \exp(V/S); I = JA$$

Where J=current density, E=electric field, V=voltage, S=space, I=current value; A=sidewall area FIG. 11a shows an example of a typical I-V characteristic curve for leakage current. FIG. 11b shows IV characteristics for samples with various spaces between the conductors. IV curve A represents perfect alignment. If misalignment causes the space between features to decrease, the IV curve measured between the more closely spaced features moves to the left as in curve B, and if the space increases, the curve moves to the right as in curve C. Comparison of leakage current IV measurements for features separated by spaces S1 and S2 can be used to calculate misalignment. The measurements can be performed in several ways: 1) Measuring full current-voltage characteristics for both spaces for a wide range of voltages; 2) measuring current values at a particular pre-selected voltage value; or 3) measuring the voltages required to achieve or force a particular pre-selected current value. The measurement region should be chosen in such a way that the results are not impacted by measurement noise, and do not impose a risk of degradation or breakdown. In other words, the measurement region should be in the intermediate region 1100; between the low current noise floor region 1103 limited by measurement setup sensitivity, and the high field degradation and destructive breakdown region 1105.

The quality of alignment and the amount of misalignment can be quantified based on the difference between leakage currents (or corresponding voltages if the constant current method is used), measured for spaces between two neighboring lines. The amount of misalignment, i.e., the difference between S1 and S2, and the direction of the misalignment can be calculated, or determined using a pre-calibrated curve of IV characteristics measured for structures with various spaces.

TABLE 2

EXAMPLES OF USAGE OF MEASURED PARAMETERS

| Double Patterning scheme | Double Exposure (two litho steps with pattern alignment) | Self-Aligned Double Pattern with Spacer (Positive Tone: Lines) | | Self-Aligned Double Pattern with Spacer (Negative Tone: Spaces) | |
|---|---|---|---|---|---|
| Measurement signals | Line 1 or Line 2 CD | Line1-Line2 Alignment | Line1 CD | Spacer thickness | Line 1 CD | Spacer thickness |
| Resistance | Resistance change (of one or both lines) | No resistance change | No Resistance change | Resistance change the same way for both lines | Resistance change of both lines in opposite directions | Only one resistance change |
| Capacitance | Capacitance change, but C1:C2 capacitance ratio = 1 | Capacitance change, and C1:C2 Capacitance ratio not equal 1 | Capacitance change and C1:C2 Capacitance ratio not equal 1 | One Capacitance change (and the Capacitance ratio not equal 1) | No Capacitance change | Capacitance change, but the Capacitance ratio will be 1 |
| Leakage Current | Leakage value change, but I1:I2 Current ratio = 1 | Leakage value change, and I1:I2 Current ratio not equal 1 | Leakage value change and C1:C2 Current ratio not equal 1 | One Leakage Current change (the Current ratio not equal 1) | No Leakage current change | Leakage value change, but the Current ratio will be 1 |

Table 2 summarizes how the measured parameters relate to changes in the critical measurements for the three double patterning schemes outlined earlier. For example, a spacer thickness change in positive tone SADP will lead to a resistance change the same way for both lines, one capacitance change (with the capacitance change ratio not equal to 1), and will also lead to one leakage current change (with the current change ratio not equal 1)

In summary, the structures and methods disclosed herein enable complete electrical characterization of features formed by a double patterning process. This provides a many great advantages over non-electrical methods (e.g., SEM, scatterometry, or cross-sectioning analysis), including the ability of non-destructive characterization of fully processed wafers or in-line characterization. The present invention is particularly well suited to (but not limited to) memory and/or logic layouts with regular patterns, such as SRAM, non-volatile memory, DRAM, or NAND. It can be utilized for many conducting layers, e.g., active, poly, local interconnect, contact, or metal. It can be applied to bit lines or word lines of memory arrays built with double patterning methods.

It is not expected that the present invention be restricted to the exact embodiments disclosed herein. Those skilled in the art will recognize that changes and modifications can be made without departing from the inventive concept. For example, sheet resistance measurements, e.g. using Van Der Pauw structures, could be incorporated to monitor the thickness of the material and the height of pattern features, hence increasing sensitivity. The scope of the invention should be construed in view of the claims. With this in mind, I claim:

What is claimed is:

1. A test configuration for use in integrated circuit manufacturing, said test configuration comprising a test structure configured to enable electrical testing of misalignment between two sets of conducting features on a semiconductor wafer portion,
    wherein said electrical testing of misalignment between two sets of conducting features on a semiconductor wafer portion comprises measurement of a space-sensitive electrical parameter to characterize gaps between features of different sub-patterns on said semiconductor wafer portion,
        further configured to enable measurement of combined multiple instances of said space-sensitive electrical parameter to provide an additive signal with increased sensitivity.

2. The test configuration of claim 1,
    configured to enable combining said features of different sub-patterns in different combinations to get differential signal changes.

3. The test configuration of claim 2, wherein said combining said features of different sub-patterns in different combinations utilizes a single test structure with a switchable configuration.

4. The test configuration of claim 3, further including measuring combined multiple instances of said capacitance to provide an additive signal with increased sensitivity, comprising an array of substantially linear features divided into sub-arrays interlaced in a comb pattern.

5. The test configuration of claim 2, wherein said combining said features of different sub-patterns in different combinations utilizes multiple congruent test structures each configured to combine features of different sub-patterns in a different single configuration.

6. The test configuration of claim 1, wherein said space-sensitive electrical parameter is capacitance, and wherein said electrical testing of misalignment between two sets of conducting features on a semiconductor wafer portion comprises comparing two sets of capacitances.

7. The test configuration of claim 1, further comprising a test structure for measuring feature dimensions, thereby improving the accuracy of diagnostics based on said measuring of a space-sensitive electrical parameter;
    wherein said test structure for measuring feature dimensions enables electrical measurement of said feature dimensions;
    wherein said test structure for measuring feature dimensions is configured such that feature resistances can be measured; and
    wherein said test structure for measuring feature resistances is a Kelvin resistance structure.

8. The test structure of claim 7, wherein said Kelvin structure includes features comprising at least a first and a second line, said first line being in a first sub-pattern, and said second line being in a second sub-pattern.

9. A test configuration for use in integrated circuit manufacturing, said test configuration comprising a test structure configured to enable electrical testing of misalignment between two sets of conducting features on a semiconductor wafer portion, wherein said misalignment of two sets of conducting features on a semiconductor wafer portion arises due to double patterning.

10. A method for electrically determining misalignment between a first set of features in a first sub-pattern and a second set of features in a second sub-pattern on a semiconductor wafer portion, said method comprising the steps of:
    performing a first measurement of space-sensitive electrical parameter between two features of said first set of features;
    performing a second measurement of said space-sensitive electrical parameter between a feature of said first set of features and a feature of said second set of features;
    comparing said first and second
    space-sensitive electrical parameter measurements; and
        from said comparison of said first and second space-sensitive electrical parameter measurements, calculating said misalignment.

11. The method of claim 10, wherein said space-sensitive electrical parameter is chosen from the group consisting of: capacitance, leakage current, and electrical parameters sensitive to the space between features.

12. The method of claim 10, further including the step of electrically measuring feature dimensions of said feature of said first set of features and said feature of said second set of features.

13. The method of claim 12, wherein said step of electrically measuring feature dimensions of said feature of said first set of features and said feature of said second set of features comprises measuring resistances of said feature of said first set of features and said feature of said second set of features.

* * * * *